US011271553B1

(12) United States Patent
Cho et al.

(10) Patent No.: US 11,271,553 B1
(45) Date of Patent: Mar. 8, 2022

(54) BUFFER CIRCUIT

(71) Applicant: SK hynix Inc., Icheon-si (KR)

(72) Inventors: Sun Ki Cho, Icheon-si (KR); Dong Uc Ko, Icheon-si (KR); Yang Ho Sur, Icheon-si (KR); Jun Yong Song, Icheon-si (KR); Sung Gil Jang, Icheon-si (KR); Hae Kang Jung, Icheon-si (KR); Min Sung Cheon, Icheon-si (KR); Chang Kyu Choi, Icheon-si (KR); Tae Jin Hwang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/171,719

(22) Filed: Feb. 9, 2021

(30) Foreign Application Priority Data

Sep. 2, 2020  (KR) ........................ 10-2020-0111435

(51) Int. Cl.
   *H03K 5/00* (2006.01)
   *H03K 5/02* (2006.01)
   *H03F 3/45* (2006.01)

(52) U.S. Cl.
   CPC ........... *H03K 5/02* (2013.01); *H03F 3/45076* (2013.01)

(58) Field of Classification Search
   None
   See application file for complete search history.

(56) References Cited

U.S. PATENT DOCUMENTS

| | | | | |
|---|---|---|---|---|
| 5,572,158 A | * | 11/1996 | Lee | ........................ H03K 5/086 327/170 |
| 5,808,498 A | * | 9/1998 | Donnelly | ............... H03H 11/18 327/255 |
| 6,452,015 B2 | * | 9/2002 | Peglion | ................... A61P 25/20 546/276.7 |
| 7,528,668 B2 | * | 5/2009 | Kim | .................... H03F 3/45183 327/156 |
| 7,567,106 B2 | * | 7/2009 | Park | ..................... H03K 5/1565 327/157 |
| 9,362,867 B2 | * | 6/2016 | Yang | ......................... H03F 3/16 |
| 10,205,441 B1 | | 2/2019 | Abhishek et al. | |
| 2003/0204767 A1 | * | 10/2003 | Ishida | .................. H03K 5/1565 713/503 |
| 2004/0189364 A1 | * | 9/2004 | Lee | ...................... H03K 5/1565 327/175 |
| 2005/0122149 A1 | * | 6/2005 | Cho | ..................... H03K 5/1565 327/175 |
| 2008/0088350 A1 | * | 4/2008 | Sohn | .................... H03K 5/1565 327/175 |
| 2009/0206901 A1 | * | 8/2009 | Song | .................... H03K 5/1565 327/175 |
| 2012/0086488 A1 | * | 4/2012 | Willey | ................. H03K 5/1565 327/175 |

* cited by examiner

*Primary Examiner* — Tuan T Lam
(74) *Attorney, Agent, or Firm* — William Park & Associates Ltd.

(57) ABSTRACT

A buffer circuit configured to receive first and second input signals through first and second input transistors coupled to a first power voltage node, output a first output signal through a first output node and a second output signal through a second output node based on the first and second input signals. A load circuit is coupled among the first output node, the second output node, and a second power voltage node and a resistance value is adjusted based on at least one of the first and second output signals.

28 Claims, 7 Drawing Sheets

BUFFER CIRCUIT

CROSS-REFERENCES TO RELATED APPLICATION

The present application claims priority under 35 U.S.C. § 119(a) to Korean application number 10-2020-0111435, filed on Sep. 2, 2020, in the Korean Intellectual Property Office, which is incorporated herein by reference in its entirety as set forth in full.

BACKGROUND

1. Technical Field

Various embodiments generally relate to an integrated circuit technology, and, more particularly, to a buffer circuit.

2. Related Art

An electronic device includes a lot of electronic elements and a computer system as the electronic device includes lots of semiconductor apparatuses each configured by a semiconductor. The semiconductor apparatuses configuring the computer system may communicate with each other by transmitting and receiving a clock signal and data. Each of the semiconductor apparatuses may include a buffer circuit configured to amplify and/or buffer an input signal to generate an output signal.

SUMMARY

In an embodiment, a buffer circuit may include a first input transistor, a second input transistor, and a load circuit. The first input transistor may be coupled between a first power voltage node and a second output node and may be configured to change a voltage level of the second output node based on a first input signal. The second input transistor may be coupled between the first power voltage node and a first output node and may be configured to change a voltage level of the first output node based on a second input signal. The load circuit may be coupled among the first output node, the second output node and a second power voltage node. A resistance value of the load circuit may be adjusted based on at least one of a first output signal output from the first output node and a second output signal output from the second output node.

In an embodiment, a buffer circuit may include a first input transistor, a second input transistor, a load control circuit, and a load circuit. The first input transistor may be coupled between a first power voltage node and a second output node and may be configured to change a voltage level of the second output node based on a first input signal. The second input transistor may be coupled between the first power voltage node and a first output node and may be configured to change a voltage level of the first output node based on a second input signal. The load control circuit may be configured to generate at least one load control signal based on a first output signal output from the first output node and a second output signal output from the second output node. The load circuit may be coupled among the first output node, the second output node, and a second power voltage node and may be configured to adjust a resistance value among the first output node, the second output node, and the second power voltage node based on the at least one load control signal.

In an embodiment, a buffer circuit may include a first input transistor, a second input transistor, a load control circuit, a first load resistor, a second load resistor, a first switching transistor, and a second switching transistor. The first input transistor may be coupled between a first power voltage node and a second output node and may be configured to change a voltage level of the second output node based on a first input signal. The second input transistor may be coupled between the first power voltage node and a first output node and may be configured to change a voltage level of the first output node based on a second input signal. The load control circuit may be configured to generate a first load control signal and a second load control signal based on a first output signal from the first output node and a second output signal from the second output node. The first load resistor may include one end coupled to the second output node and the other end coupled to the second power voltage node. The second load resistor may include one end coupled to the first output node and the other end coupled to the second power voltage node. The first switching transistor may be configured to couple the one end of the first load resistor and the one end of the second load resistor to each other based on the first load control signal. The second switching transistor may be configured to couple the one end of the first load resistor and the one end of the second load resistor to each other based on the second load control signal.

DETAILED DESCRIPTION

In general, a buffer circuit may be a differential amplifier configured to differentially amplify a positive input signal and a negative input signal to generate an output signal. As an operational speed of the semiconductor apparatus increases, an output signal generated from the buffer circuit tends to have a distorted duty ratio. Proposed has been a buffer circuit, to which a circuit configured to adjust the duty ratio of the output signal is added. However, the gain and the bandwidth of the buffer circuit may decrease due to the load of the circuit added to the buffer circuit.

Hereinafter, embodiments will be described with reference to the accompanying drawings.

Figure 1:
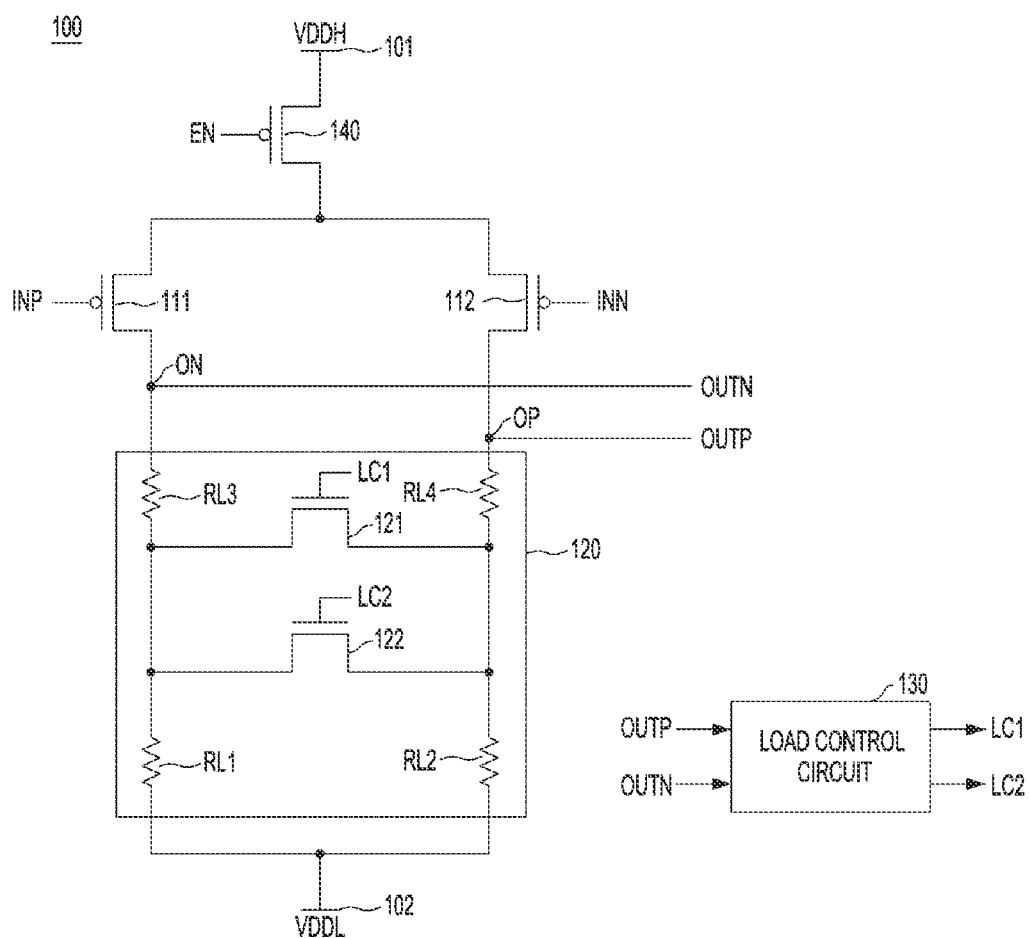
FIG. 1 is a diagram illustrating a configuration of a buffer circuit in accordance with an embodiment.

FIG. 1 is a diagram illustrating a configuration of a buffer circuit 100 in accordance with an embodiment. Referring to FIG. 1, the buffer circuit 100 may receive a first input signal INP and a second input signal INN to generate output signals OUTP and OUTN. The buffer circuit 100 may differentially amplify the first input signal INP and the second input signal INN to generate the output signals OUTP and OUTN. The signal input to the buffer circuit 100 may be a differential signal or a single-ended signal. When the signal input to the buffer circuit 100 is a differential signal, the second input signal INN may be a complementary signal having an opposite voltage level to that of the first input signal INP. When the signal input to the buffer circuit 100 is a single-ended signal, the second input signal INN may be a reference voltage. The reference voltage may have a voltage level corresponding to a middle of a voltage level range that the first input signal INP swings. The output signals OUTP and OUTN may include a first output signal OUTP and a second output signal OUTN. The first output signal OUTP may have a voltage level that changes according to the voltage level change of the first input signal INP. The second output signal OUTN may have an opposite voltage level to that of the first output signal OUTP. The second output signal OUTN may be a complementary signal to the first output signal OUTP. The second output signal OUTN may have a voltage level that changes according to the voltage level change of the second input signal INN. The buffer circuit 100 may adjust duty ratio(s) and/or phase(s) of the first output signal OUTP and/or the second output signal OUTN by adjusting transition timing(s) of the voltage level(s) of the first output signal OUTP and/or the second output signal OUTN and transition timing(s) of the logic level(s) of the first output signal OUTP and/or the second output signal OUTN. In order to adjust the duty ratio(s) and/or phase(s) of the first output signal OUTP and/or the second output signal OUTN, the buffer circuit 100 may control a load and/or a current of the buffer circuit 100. For example, the buffer circuit 100 may adjust the duty ratio(s) and/or phase(s) of the first output signal OUTP and/or the second output signal OUTN by adjusting a resistance value of the load. The buffer circuit 100 may adjust the duty ratio(s) and/or phase(s) of the first output signal OUTP and/or the second output signal OUTN by adjusting an amount of the current discharged from node(s) outputting the first output signal OUTP and/or the second output signal OUTN.

The buffer circuit 100 may include a first input transistor 111, a second input transistor 112, and a load circuit 120. The first input transistor 111 may be coupled between a first power voltage node 101 and a second output node ON. The first input transistor 111 may receive the first input signal INP. The first input transistor 111 may change the voltage level of the second output node ON based on the first input signal INP. The first power voltage node 101 may be a voltage rail, through which a first power voltage VDDH is provided. The second output signal OUTN may be output through the second output node ON. The second output node ON may be a negative output node. The second input transistor 112 may be coupled between the first power voltage node 101 and a first output node OP. The second input transistor 112 may receive the second input signal INN. The second input transistor 112 may change the voltage level of the first output node OP based on the second input signal INN. The first output signal OUTP may be output through the first output node OP. The first output node OP may be a positive output node. Each of the first input transistor 111 and the second input transistor 112 may be a P-channel Metal-Oxide Semiconductor (MOS) transistor.

The load circuit 120 may be coupled among the first output node OP, the second output node ON, and a second power voltage node 102. The second power voltage node 102 may be a voltage rail, through which a second power voltage VDDL is provided. The first power voltage VDDH may have a higher voltage level than the second power voltage VDDL. A resistance value of the load circuit 120 may be adjusted on the basis of at least one of the first output signal OUTP and the second output signal OUTN. When the resistance value of the load circuit 120 is adjusted, the duty ratio and/or phase of the first output signal OUTP may be adjusted. For example, the buffer circuit 100 may increase or decrease the duty ratio of the first output signal OUTP by adjusting the resistance value of the load circuit 120. The buffer circuit 100 may advance the phase of the first output signal OUTP. In order to decrease the duty ratio of the first output signal OUTP, the buffer circuit 100 may decrease the resistance value of the load circuit 120 in a time period when the voltage level of the first output signal OUTP is a logic high level. The duty ratio of the first output signal OUTP may be defined as a ratio of a high-level section of the first output signal OUTP to a low-level section of the first output signal OUTP. In order to increase the duty ratio of the first output signal OUTP, the buffer circuit 100 may decrease the resistance value of the load circuit 120 in a time period when the voltage level of the second output signal OUTN is a logic high level. In order to advance the phase of the first output signal OUTP, the buffer circuit 100 may decrease the resistance value of the load circuit 120 in the time period when the voltage level of the first output signal OUTP is a logic high level and may also decrease the resistance value of the load circuit 120 in the time period when the voltage level of the second output signal OUTN is a logic high level.

The buffer circuit 100 may further include a load control circuit 130. The load control circuit 130 may receive the first output signal OUTP and the second output signal OUTN to generate at least one load control signal. In order to adjust the duty ratio of the first output signal OUTP, the load control circuit 130 may generate one load control signal based on the first output signal OUTP. In order to adjust the duty ratio of the first output signal OUTP, the load control circuit 130 may generate one load control signal based on the second output signal OUTN. In order to advance the phase of the first output signal OUTP, the load control circuit 130 may generate one load control signal based on the first output signal OUTP and may generate another load control signal based on the second output signal OUTN. The load control circuit 130 may generate a first load control signal LC1 and a second load control signal LC2 based on the first output signal OUTP and the second output signal OUTN. The load control circuit 130 may provide the first output signal OUTP as the first load control signal LC1 and may provide the second output signal OUTN as the second load control signal LC2. For example, in order to decrease the duty ratio of the first output signal OUTP, the load control circuit 130 may provide the first output signal OUTP as the first load control signal LC1 while keeping the second load control signal LC2 disabled. The second load control signal LC2 may be disabled to a logic low level. In order to increase the duty ratio of the first output signal OUTP, the load control circuit 130 may provide the second output signal OUTN as the second load control signal LC2 while keeping the first load control signal LC1 disabled. The first load control signal LC1 may be disabled to a logic low level. In order to advance the phase of the first output signal OUTP, the load control circuit 130 may provide the first output signal OUTP as the first load control signal LC1 and may provide the second output signal OUTN as the second load control signal LC2.

The load circuit 120 may receive the at least one load control signal from the load control circuit 130. The load circuit 120 may adjust the resistance value among the first output node OP, the second output node ON, and the second power voltage node 102 based on the least one load control signal. The load circuit 120 may include a first load resistor RL1, a second load resistor RL2 and at least one switching transistor. The first load resistor RL1 may be coupled between the second output node ON and the second power voltage node 102. One end of the first load resistor RL1 may be coupled to the second output node ON and the other end of the first load resistor RL1 may be coupled to the second power voltage node 102. The second load resistor RL2 may be coupled between the first output node OP and the second power voltage node 102. One end of the second load resistor RL2 may be coupled to the first output node OP and the other end of the second load resistor RL2 may be coupled to the second power voltage node 102. The resistance value of the second load resistor RL2 may be substantially the same as the resistance value of the first load resistor RL1. In an embodiment, the resistance value of the second load resistor RL2 may be different from the resistance value of the first load resistor RL1. The first load resistor RL1 may form a current path from the second output node ON to the second power voltage node 102. The second load resistor RL2 may form a current path from the first output node OP to the second power voltage node 102.

The at least one switching transistor may couple the first load resistor RL1 and the second load resistor RL2 to each other in parallel based on the at least one load control signal. When the at least one switching transistor is turned on and couples the first load resistor RL1 and the second load resistor RL2 to each other in parallel, the resistance value of the load circuit 120 may decrease. The load circuit 120 may include a first switching transistor 121 and a second switching transistor 122. The first switching transistor 121 may be coupled between one end of the first load resistor RL1 and one end of the second load resistor RL2. The first switching transistor 121 may receive the first load control signal LC1. The first switching transistor 121 may couple the first load resistor RL1 and the second load resistor RL2 to each other in parallel based on the first load control signal LC1. The second switching transistor 122 may be coupled between the one end of the first load resistor RL1 and the one end of the second load resistor RL2. The second switching transistor 122 may receive the second load control signal LC2. The second switching transistor 122 may couple the first load resistor RL1 and the second load resistor RL2 to each other in parallel based on the second load control signal LC2. When each of the first input transistor 111 and the second input transistor 112 is a P-channel MOS transistor, each of the first switching transistor 121 and the second switching transistor 122 may be a N-channel MOS transistor.

The load circuit 120 may further include a third load resistor RL3 and a fourth load resistor RL4. The third load resistor RL3 may be serially coupled to the first load resistor RL1 between the second output node ON and the first load resistor RL1. The fourth load resistor RL4 may be serially coupled to the second load resistor RL2 between the first output node OP and the second load resistor RL2. A resistance value of the fourth load resistor RL4 may be substantially the same as a resistance value of the third load resistor RL3. When one of the first switching transistor 121 and the second switching transistor 122 is turned on, formed may be an electrical connection between the first output node OP and the second output node ON. The third load resistor RL3 and the fourth load resistor RL4 may prevent the equalization of the first output node OP and the second output node ON such that the voltage level of one of the first output node OP and the second output node ON does not affect the voltage level of the other one of the first output node OP and the second output node ON in an evaluation time period when there occurs voltage level difference between the first output node OP and the second output node ON.

The buffer circuit 100 may further include an enable transistor 140. The enable transistor 140 may be coupled among the first power voltage node 101, the first input transistor 111, and the second input transistor 112. The enable transistor 140 may receive an enable signal EN. The enable signal EN may be a control signal for enabling the buffer circuit 100. When the enable signal EN is enabled to a logic low level, the enable transistor 140 may couple the first power voltage node 101 to the first input transistor 111 and the second input transistor 112 and form current paths from the first power voltage node 101 to the respective first input transistor 111 and second input transistor 112.

Figure 2:
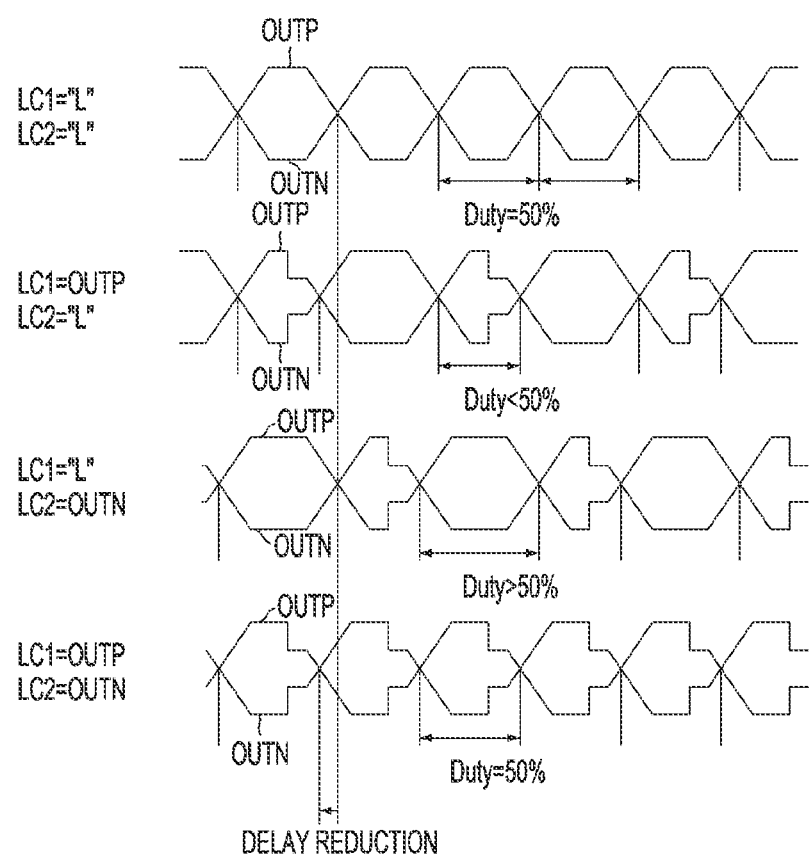
FIG. 2 is a diagram illustrating an operation of a buffer circuit in accordance with an embodiment.

FIG. 2 is a diagram illustrating an operation of a buffer circuit in accordance with an embodiment. FIG. 2 shows the waveforms of the first output signal OUTP and the second output signal OUTN, which are output from the buffer circuit 100 of FIG. 1 according to the operation of the buffer circuit 100. Hereinafter, described with reference to FIGS. 1 and 2 will be the operation of the buffer circuit 100 in accordance with an embodiment. When the buffer circuit 100 does not perform any compensation operation on the first output signal OUTP, both of the first load control signal LC1 and the second load control signal LC2 may be disabled to a logic low level ("L"). Since the load circuit 120 receives the first load control signal LC1 and the second load control signal LC2, which are disabled, the resistance value of the load circuit 120 might not change. In an ideal case, when each of the duty ratios of the first input signal INP and the second input signal INN is 50:50, each of the first output signal OUTP and the second output signal OUTN output from the buffer circuit 100 may have the duty ratio of 50:50 ("Duty=50%"). However, even when each of the duty ratios of the first input signal INP and the second input signal INN is 50:50, the first output signal OUTP might not keep the duty ratio of 50% due to the characteristics (e.g. process variation) of a buffer circuit or an offset. Also, the output timing of the first output signal OUTP and the second output signal OUTN may be delayed. The buffer circuit 100 may compensate the process variation and the offset of the buffer circuit 100 by adjusting the duty ratio(s) and/or the phase(s) of the first output signal OUTP and/or the second output signal OUTN.

In order to decrease the duty ratio of the first output signal OUTP, the load control circuit 130 may output the first output signal OUTP as the first load control signal LC1 while keeping the second load control signal LC2 disabled to a logic low level ("L"). The first switching transistor 121 may be turned on in a time period when the voltage level of the first load control signal LC1 is a logic high level, i.e., in a time period when the voltage level of the first output signal OUTP is a logic high level. When the first switching transistor 121 is turned on, the first load resistor RL1 and the second load resistor RL2 may be coupled to each other in parallel and therefore the resistance value among the first output node OP, the second output node ON, and the second power voltage node 102 may decrease. When the resistance value among the first output node OP, the second output node ON, and the second power voltage node 102 decreases, the amounts of the currents discharged from the first output node OP and the second output node ON to the second power voltage node 102 may increase and the voltage levels of the first output node OP and the second output node ON may decrease. When the voltage level of the first output signal OUTP transitions from a logic low level to a logic high level and the voltage level of the second output signal OUTN transitions from a logic high level to a logic low level, the first load control signal LC1 may also transition to a logic high level. When the first switching transistor 121 is turned on and couples the first load resistor RL1 and the second load resistor RL2 to each other in parallel, the voltage level of the first output signal OUTP may decrease and the swing range of the first output signal OUTP and the second output signal OUTN may decrease. For example, the swing range of a signal may be an amplitude of the signal, and may be a voltage range between a maximum voltage level and a minimum voltage level which the signal swings. When the voltage level of the first output signal OUTP decreases, time required for the first output signal OUTP to transition from a logic high level to a logic low level may decrease and duration of the high-level section of the first output signal OUTP may decrease. Also, time required for the second output signal OUTN to transition from a logic low level to a logic high level may decrease and duration of the low-level section of the second output signal OUTN may decrease. Therefore, the duty ratio of the first output signal OUTP may decrease ("Duty<50%") and the duty ratio of the second output signal OUTN may increase.

In order to increase the duty ratio of the first output signal OUTP, the load control circuit 130 may output the second output signal OUTN as the second load control signal LC2 while keeping the first load control signal LC1 disabled to a logic low level ("L"). The second switching transistor 122 may be turned on in a time period when the voltage level of the second load control signal LC2 is a logic high level, i.e., in a time period when the voltage level of the second output signal OUTN is a logic high level. When the second switching transistor 122 is turned on, the first load resistor RL1 and the second load resistor RL2 may be coupled to each other in parallel and therefore the resistance value among the first output node OP, the second output node ON, and the second power voltage node 102 may decrease. When the resistance value among the first output node OP, the second output node ON, and the second power voltage node 102 decreases, the amounts of the currents discharged from the first output node OP and the second output node ON to the second power voltage node 102 may increase and the voltage levels of the first output node OP and the second output node ON may decrease. When the voltage level of the first output signal OUTP transitions from a logic high level to a logic low level and the voltage level of the second output signal OUTN transitions from a logic low level to a logic high level, the second load control signal LC2 may also transition to a logic high level. When the second switching transistor 122 is turned on and couples the first load resistor RL1 and the second load resistor RL2 to each other in parallel, the voltage level of the second output signal OUTN may decrease and the swing range of the second output signal OUTN and the first output signal OUTP may decrease. When the voltage level of the second output signal OUTN decreases, time required for the second output signal OUTN to transition from a logic high level to a logic low level may decrease and duration of the high-level section of the second output signal OUTN may decrease. Also, time required for the first output signal OUTP to transition from a logic low level to a logic high level may decrease and duration of the low-level section of the first output signal OUTP may decrease. Therefore, the duty ratio of the first output signal OUTP may increase ("Duty>50%") and the duty ratio of the second output signal OUTN may decrease.

In order to advance the phase of the first output signal OUTP, the load control circuit 130 may output the first output signal OUTP as the first load control signal LC1 and may output the second output signal OUTN as the second load control signal LC2. The first switching transistor 121 may be turned on in a time period when the voltage level of the first load control signal LC1 is a logic high level, i.e., in a time period when the voltage level of the first output signal OUTP is a logic high level. The second switching transistor 122 may be turned on in a time period when the voltage level of the second load control signal LC2 is a logic high level, i.e., in a time period when the voltage level of the second output signal OUTN is a logic high level. Therefore, the first load resistor RL1 and the second load resistor RL2 may continuously stay coupled to each other in parallel. In a time period when the voltage level of the first output signal OUTP is a logic high level, the voltage level of the first output signal OUTP may decrease and the swing range of the first output signal OUTP and the second output signal OUTN may decrease. In a time period when the voltage level of the second output signal OUTN is a logic high level, the voltage level of the second output signal OUTN may decrease and the swing range of the second output signal OUTN and the first output signal OUTP may decrease. Therefore, time required for the first output signal OUTP to transition from a logic low level to a logic high level and time required for the first output signal OUTP to transition from a logic high level to a logic low level may all decrease. In a similar way, time required for the second output signal OUTN to transition from a logic low level to a logic high level and time required for the second output signal OUTN to transition from a logic high level to a logic low level may all decrease. When the transition time of the first output signal OUTP and the second output signal OUTN decrease, delay time required to generate the first output signal OUTP and the second output signal OUTN may decrease ("Delay Reduction") while the duty ratios of the first output signal OUTP and the second output signal OUTN are kept ("Duty=50%"). Accordingly, the phases of the first output signal OUTP and the second output signal OUTN may be advanced.

Figure 3:
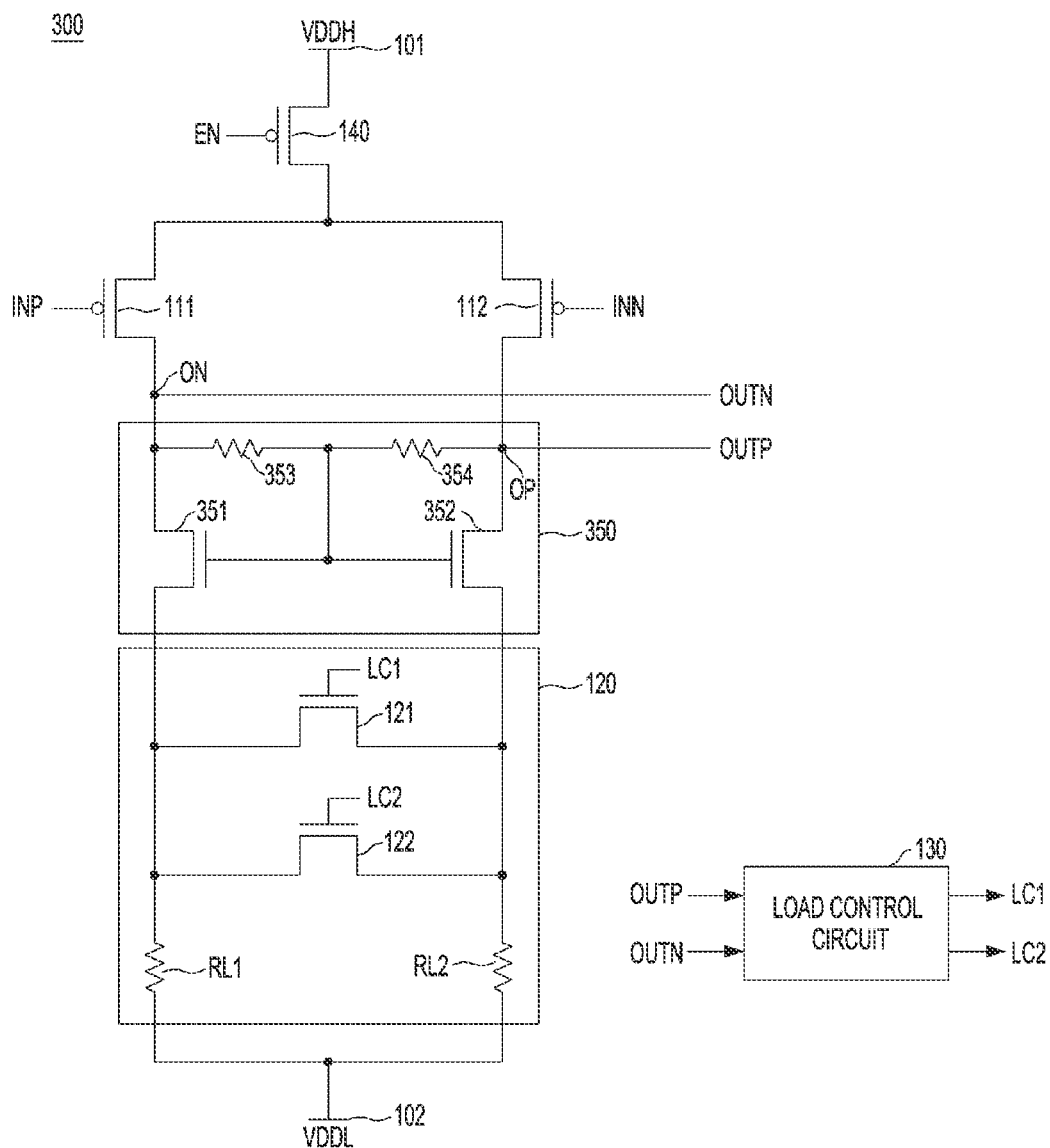
FIG. 3 is a diagram illustrating a configuration of a buffer circuit in accordance with an embodiment.

FIG. 3 is a diagram illustrating a configuration of a buffer circuit 300 in accordance with an embodiment. Except a partial configuration, the buffer circuit 300 may have the same configuration as the buffer circuit 100 illustrated in FIG. 1. Between the embodiments of FIGS. 1 and 3, the same elements have the same reference numerals and redundant description on the same elements will be omitted. Referring to FIG. 3, the buffer circuit 300 may additionally include a common mode load circuit 350. The common mode load circuit 350 may be coupled among the first output node OP, the second output node ON, and the load circuit 120. The common mode load circuit 350 may operate as a load of the buffer circuit 300 based on a common mode voltage of the buffer circuit 300. The common mode voltage may have a voltage level corresponding to a middle of the voltage level difference between the first output signal OUTP and the second output signal OUTN.

The common mode load circuit 350 may include a first transistor 351, a second transistor 352, a first resistor 353, and a second resistor 354. The first transistor 351 may be coupled to the second output node ON and one end of the first load resistor RL1. The second transistor 352 may be coupled to the first output node OP and one end of the second load resistor RL2. When each of the first input transistor 111 and the second input transistor 112 is a P-channel MOS transistor, each of the first transistor 351 and the second transistor 352 may be a N-channel MOS transistor. The first transistor 351 may be coupled to the second output node ON at its drain and the one end of the first load resistor RL1 at its source. The second transistor 352 may be coupled to the first output node OP at its drain and the one end of the second load resistor RL2 at its source. One end of the first resistor 353 may be coupled to the second output node ON and the other end of the first resistor 353 may be commonly coupled to gates of the first transistor 351 and the second transistor 352. One end of the second resistor 354 may be coupled to the first output node OP and the other end of the second resistor 354 may be commonly coupled to the gates of the first transistor 351 and the second transistor 352.

Figure 4:
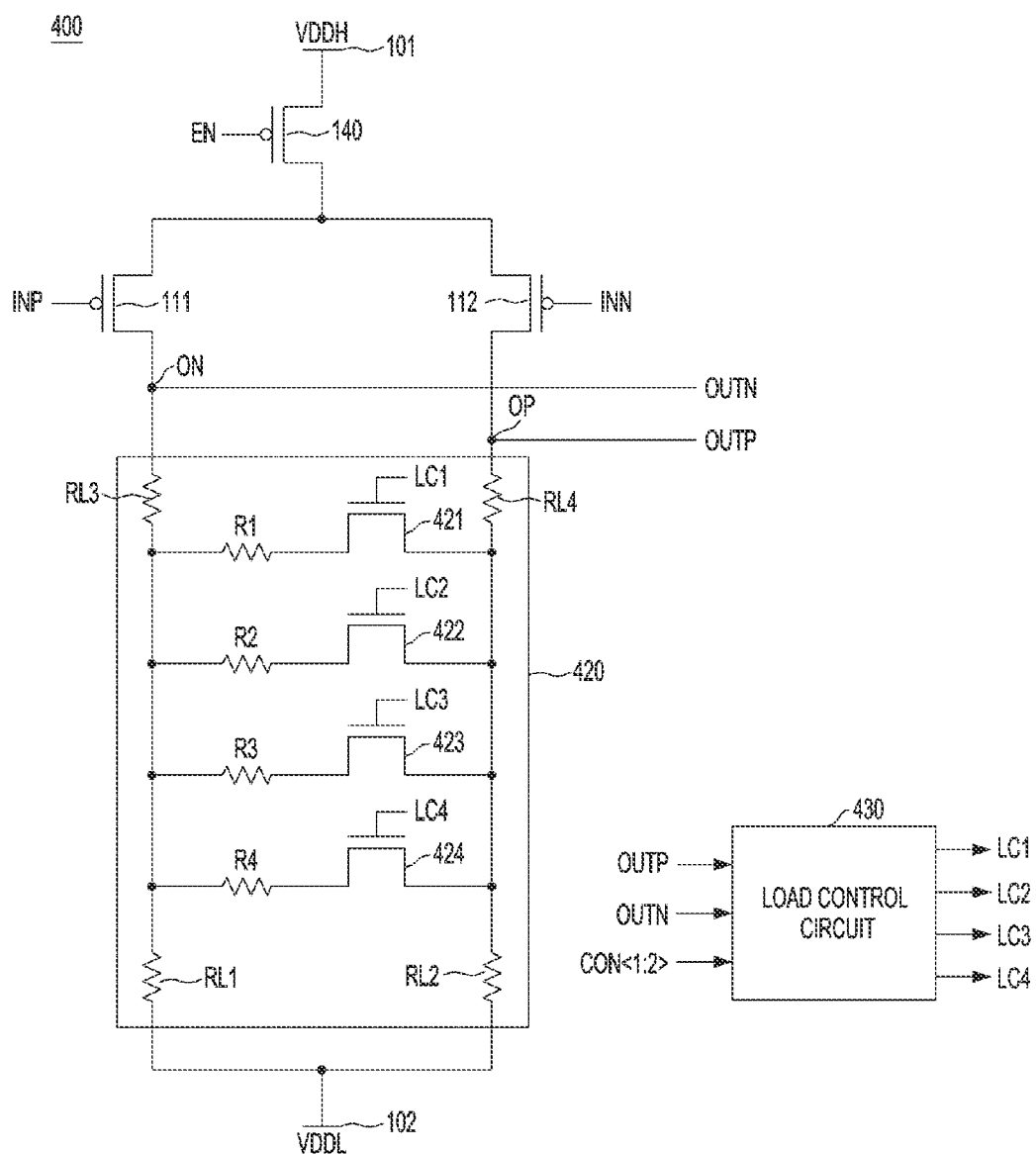
FIG. 4 is a diagram illustrating a configuration of a buffer circuit in accordance with an embodiment.

FIG. 4 is a diagram illustrating a configuration of a buffer circuit 400 in accordance with an embodiment. The buffer circuit 400 may have a similar configuration to the buffer circuit 100 illustrated in FIG. 1. Between the embodiments of FIGS. 1 and 4, the same elements have the same reference numerals and redundant description on the same elements will be omitted. The buffer circuit 400 may variously change an amount to be adjusted in the duty ratio of the first output signal OUTP and an amount to be adjusted in the phase of the first output signal OUTP. The buffer circuit 400 may include a load circuit 420 and a load control circuit 430. The load circuit 120 and the load control circuit 130 of FIG. 1 may be modified to become the load circuit 420 and the load control circuit 430, respectively. The load circuit 420 may have various resistance values to change amount(s) to be adjusted in the duty ratio and/or the phase of the first output signal OUTP. The load control circuit 430 may generate a greater number of load control signals to variously change the resistance value of the load circuit 420.

Referring to FIG. 4, the load control circuit 430 may receive the first output signal OUTP and the second output signal OUTN and may further receive a resistance control signal CON<1:2>. The resistance control signal CON<1:2> may be a digital code signal having a plurality of bits. The resistance control signal CON<1:2> may be generated on the basis of any control signal utilized in a semiconductor apparatus including the buffer circuit 400. A number of bits included in the resistance control signal CON<1:2> may be proportional to a number of the switching transistors included in the load circuit 420. The load control circuit 430 may generate a first load control signal LC1 and a third load control signal LC3 based on the first output signal OUTP and the resistance control signal CON<1:2>. The load control circuit 430 may generate a second load control signal LC2 and a fourth load control signal LC4 based on the second output signal OUTN and the resistance control signal CON<1:2>.

In order to decrease the duty ratio of the first output signal OUTP, the load control circuit 430 may provide the first output signal OUTP as the first load control signal LC1 and the third load control signal LC3 while keeping the second load control signal LC2 and the fourth load control signal LC4 disabled. Each of the second load control signal LC2 and the fourth load control signal LC4 may be disabled to a logic low level. Based on the resistance control signal CON<1:2>, the load control circuit 430 may selectively output each of the first load control signal LC1 and the third load control signal LC3. The resistance control signal CON<1:2> may have various logic values to adjust the amount to decrease in the duty ratio of the first output signal OUTP. For example, when all the bits of the resistance control signal CON<1:2> have a logic high level, the load control circuit 430 may output both of the first load control signal LC1 and the third load control signal LC3. When the first bit CON<1> has a logic high level and the second bit CON<2> has a logic low level in the resistance control signal CON<1:2>, the load control circuit 430 may output the first load control signal LC1 and might not output the third load control signal LC3. When the second bit CON<2> has a logic high level and the first bit CON<1> has a logic low level in the resistance control signal CON<1:2>, the load control circuit 430 may output the third load control signal LC3 and might not output the first load control signal LC1.

In order to increase the duty ratio of the first output signal OUTP, the load control circuit 430 may provide the second output signal OUTN as the second load control signal LC2 and the fourth load control signal LC4 while keeping the first load control signal LC1 and the third load control signal LC3 disabled. Each of the first load control signal LC1 and the third load control signal LC3 may be disabled to a logic low level. Based on the resistance control signal CON<1:2>, the load control circuit 430 may selectively output each of the second load control signal LC2 and the fourth load control signal LC4. The resistance control signal CON<1:2> may have various logic values to adjust the amount to increase in the duty ratio of the first output signal OUTP. For example, when all the bits of the resistance control signal CON<1:2> have a logic high level, the load control circuit 430 may output both of the second load control signal LC2 and the fourth load control signal LC4. When the first bit CON<1> has a logic high level and the second bit CON<2> has a logic low level in the resistance control signal CON<1:2>, the load control circuit 430 may output the second load control signal LC2 and might not output the fourth load control signal LC4. When the second bit CON<2> has a logic high level and the first bit CON<1> has a logic low level in the resistance control signal CON<1:2>, the load control circuit 430 may output the fourth load control signal LC4 and might not output the second load control signal LC2.

In order to advance the phase of the first output signal OUTP, the load control circuit 430 may provide the first output signal OUTP as the first load control signal LC1 and the third load control signal LC3 and may provide the second output signal OUTN as the second load control signal LC2 and the fourth load control signal LC4. Based on the resistance control signal CON<1:2>, the load control circuit 430 may selectively output each of the first to fourth load control signals LC1 to LC4. The resistance control signal CON<1:2> may have various logic values to change the amount to be adjusted in the phase of the first output signal OUTP. For example, when all the bits of the resistance control signal CON<1:2> have a logic high level, the load control circuit 430 may output all the first to fourth load control signals LC1 to LC4. When the first bit CON<1> has a logic high level and the second bit CON<2> has a logic low level in the resistance control signal CON<1:2>, the load control circuit 430 may output the first load control signal LC1 and the second load control signal LC2 and might not output the third load control signal LC3 or the fourth load control signal LC4. When the second bit CON<2> has a logic high level and the first bit CON<1> has a logic low level in the resistance control signal CON<1:2>, the load control circuit 430 may output the third load control signal LC3 and the fourth load control signal LC4 and might not output the first load control signal LC1 or the second load control signal LC2.

The load circuit 420 may variously adjust the resistance value among the first output node OP, the second output node ON, and the second power voltage node 102 based on the first to fourth load control signals LC1 to LC4. The load circuit 420 may include a first load resistor RL1, a second load resistor RL2, a first switching transistor 421, a second switching transistor 422, a third switching transistor 423, and a fourth switching transistor 424. The first switching transistor 421 may be coupled between one end of the first load resistor RL1 and one end of the second load resistor RL2. The first switching transistor 421 may receive the first load control signal LC1. The second switching transistor 422 may be coupled between the one end of the first load resistor RL1 and the one end of the second load resistor RL2. The second switching transistor 422 may receive the second load control signal LC2. The third switching transistor 423 may be coupled between the one end of the first load resistor RL1 and the one end of the second load resistor RL2. The third switching transistor 423 may receive the third load control signal LC3. The fourth switching transistor 424 may be coupled between the one end of the first load resistor RL1 and the one end of the second load resistor RL2. The fourth switching transistor 424 may receive the fourth load control signal LC4. A turn-on resistance value of the third switching transistor 423 may be the same as or different from a turn-on resistance value of the first switching transistor 421. For example, a turn-on resistance value of a transistor may refer a resistance value which the transistor has when the transistor is turned-on. A turn-on resistance value of the fourth switching transistor 424 may be the same as or different from a turn-on resistance value of the second switching transistor 422. For example, when the turn-on resistance value of the first switching transistor 421 is smaller than the turn-on resistance value of the third switching transistor 423, the load control circuit 430 may output both of the first load control signal LC1 and the third load control signal LC3 to adjust, to a maximum, the amount to decrease in the resistance value of the load circuit 420. The load control circuit 430 may output only the third load control signal LC3 to adjust, to a minimum, the amount to decrease in the resistance value of the load circuit 420. The load control circuit 430 may output only the first load control signal LC1 to adjust, between the maximum and the minimum, the amount to decrease in the resistance value of the load circuit 420. In a similar way, when the turn-on resistance value of the second switching transistor 422 is smaller than the turn-on resistance value of the fourth switching transistor 424, the load control circuit 430 may output both of the second load control signal LC2 and the fourth load control signal LC4 to adjust, to a maximum, the amount to decrease in the resistance value of the load circuit 420. The load control circuit 430 may output only the fourth load control signal LC4 to adjust, to a minimum, the amount to decrease in the resistance value of the load circuit 420. The load control circuit 430 may output only the second load control signal LC2 to adjust, between the maximum and the minimum, the amount to decrease in the resistance value of the load circuit 420.

The load circuit 420 may further include a first resistor R1, a second resistor R2, a third resistor R3, and a fourth resistor R4. The first resistor R1 may be serially coupled to the first switching transistor 421. The second resistor R2 may be serially coupled to the second switching transistor 422. The third resistor R3 may be serially coupled to the third switching transistor 423. The fourth resistor R4 may be serially coupled to the fourth switching transistor 424. A resistance value of the third resistor R3 may be the same as or different from a resistance value of the first resistor R1. A resistance value of the fourth resistor R4 may be the same as or different from a resistance value of the second resistor R2. The first resistor R1 and the third resistor R3 may be serially coupled to the first switching transistor 421 and the third switching transistor 423, respectively, to variously change the amount that the buffer circuit 400 is to adjust in the duty ratio of the first output signal OUTP or the amount that the buffer circuit 400 is to adjust in the phase of the first output signal OUTP. The second resistor R2 and the fourth resistor R4 may be serially coupled to the second switching transistor 422 and the fourth switching transistor 424, respectively, to variously change the amount that the buffer circuit 400 is to adjust in the duty ratio of the first output signal OUTP or the amount that the buffer circuit 400 is to adjust in the phase of the first output signal OUTP.

The load circuit 420 may further include a third load resistor RL3 and a fourth load resistor RL4. The third load resistor RL3 may be serially coupled to the first load resistor RL1 between the second output node ON and the first load resistor RL1. The fourth load resistor RL4 may be serially coupled to the second load resistor RL2 between the first output node OP and the second load resistor RL2. A resistance value of the fourth load resistor RL4 may be substantially the same as a resistance value of the third load resistor RL3.

Figure 5:
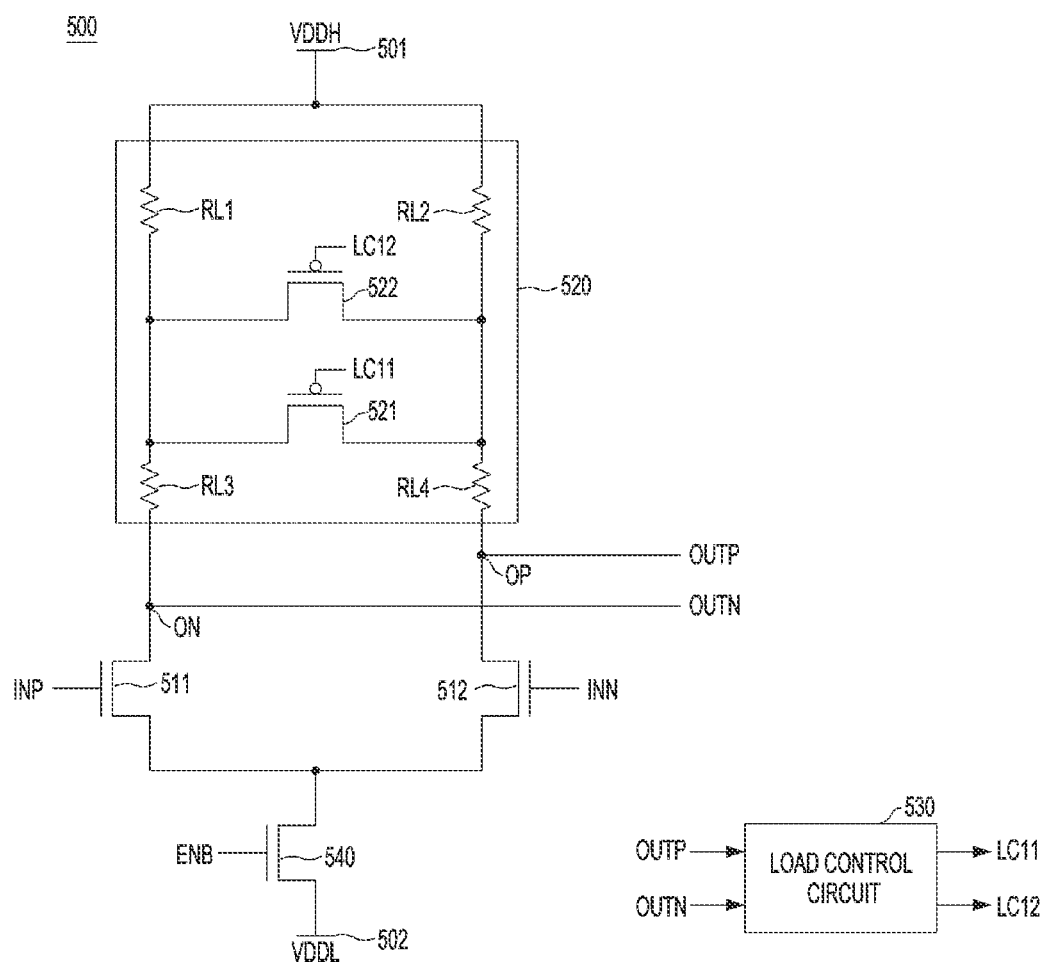
FIG. 5 is a diagram illustrating a configuration of a buffer circuit in accordance with an embodiment.

FIG. 5 is a diagram illustrating a configuration of a buffer circuit 500 in accordance with an embodiment. The buffer circuit 500 may have a similar configuration to the buffer circuit 100 illustrated in FIG. 1. Between the embodiments of FIGS. 1 and 5, similar elements have similar reference numerals. Referring to FIG. 5, the buffer circuit 500 may adjust duty ratio(s) and/or phase(s) of the first output signal OUTP and/or the second output signal OUTN by adjusting the resistance value of the load. The buffer circuit 500 may adjust duty ratio(s) and/or phase(s) of the first output signal OUTP and/or the second output signal OUTN by adjusting an amount of the current provided to the node(s) outputting the first output signal OUTP and/or the second output signal OUTN. The buffer circuit 500 may include a first input transistor 511, a second input transistor 512, a load circuit 520, and a load control circuit 530. Each of the first input signal INP and the second input signal INN may have various swing ranges according to a common mode. The first input signal INP and the second input signal INN may swing in a range of a relatively high voltage level or in a range of a relatively low voltage level. A N-channel MOS transistor may respond well when a signal provided to a gate thereof has a relatively high voltage level. A P-channel MOS transistor may respond well when a signal provided to a gate thereof has a relatively low voltage level. The buffer circuit 100 of FIG. 1 may be suitable for receiving the first input signal INP and the second input signal INN, which swing in a range of a relatively low voltage level, since each of the first input transistor 111 and the second input transistor 112 is a P-channel MOS transistor. Each of the first input transistor 511 and the second input transistor 512 of the buffer circuit 500 may be a N-channel MOS transistor and thus the buffer circuit 500 may be suitable for receiving the first input signal INP and the second input signal INN, which swing in a range of a relatively high voltage level. The first input transistor 511 may be coupled between the second output node ON and a second power voltage node 502. The first input transistor 511 may receive the first input signal INP. The second input transistor 512 may be coupled between the first output node OP and the second power voltage node 502. The second input transistor 512 may receive the second input signal INN.

The load circuit 520 may be coupled among a first power voltage node 501, the first output node OP, and the second output node ON. The load circuit 520 may include a first load resistor RL1, a second load resistor RL2, a first switching transistor 521, and a second switching transistor 522. Each of the first switching transistor 521 and the second switching transistor 522 may be a N-channel MOS transistor. The first switching transistor 521 may be coupled between one end of the first load resistor RL1 and one end of the second load resistor RL2. The first switching transistor 521 may receive a first load control signal LC11. The second switching transistor 522 may be coupled between the one end of the first load resistor RL1 and the one end of the second load resistor RL2. The second switching transistor 522 may receive a second load control signal LC12.

The load circuit 520 may further include a third load resistor RL3 and a fourth load resistor RL4. The third load resistor RL3 may be serially coupled to the first load resistor RL1 between the second output node ON and the first load resistor RL1. The fourth load resistor RL4 may be serially coupled to the second load resistor RL2 between the first output node OP and the second load resistor RL2. A resistance value of the fourth load resistor RL4 may be substantially the same as a resistance value of the third load resistor RL3.

The load control circuit 530 may generate the first load control signal LC11 and the second load control signal LC12 based on the first output signal OUTP and the second output signal OUTN. The load control circuit 530 may provide the first output signal OUTP as the first load control signal LC11 and may provide the second output signal OUTN as the second load control signal LC12. In order to increase the duty ratio of the first output signal OUTP, the load control circuit 530 may provide the first output signal OUTP as the first load control signal LC11 while keeping the second load control signal LC12 disabled. The second load control signal LC12 may be disabled to a logic high level. In order to decrease the duty ratio of the first output signal OUTP, the load control circuit 530 may provide the second output signal OUTN as the second load control signal LC12 while keeping the first load control signal LC11 disabled. The first load control signal LC11 may be disabled to a logic high level. In order to advance the phase of the first output signal OUTP, the load control circuit 530 may generate the first load control signal LC11 based on the first output signal OUTP and may generate the second load control signal LC12 based on the second output signal OUTN.

The buffer circuit 500 may further include an enable transistor 540. The enable transistor 540 may be coupled among the first input transistor 511, the second input transistor 512, and the second power voltage node 502. The enable transistor 540 may receive an enable signal ENB. The enable transistor 540 may be a N-channel MOS transistor. When the enable signal ENB is enabled to a logic high level, the enable transistor 540 may couple the first input transistor 511 and the second input transistor 512 to the second power voltage node 502 and form current paths from the respective first input transistor 511 and second input transistor 512 to the second power voltage node 502.

Hereinafter, described will be the operation of the buffer circuit 500 in accordance with an embodiment. In order to increase the duty ratio of the first output signal OUTP, the load control circuit 530 may output the first output signal OUTP as the first load control signal LC11 while keeping the second load control signal LC12 disabled. The first switching transistor 521 may be turned on in a time period when the voltage level of the first load control signal LC11 is a logic low level, i.e., in a time period when the voltage level of the first output signal OUTP is a logic low level. When the first switching transistor 521 is turned on, the first load resistor RL1 and the second load resistor RL2 may be coupled to each other in parallel and therefore the resistance value among the first power voltage node 501, the first output node OP, and the second output node ON may decrease. When the resistance value among the first power voltage node 501, the first output node OP, and the second output node ON decreases, the amounts of the currents provided from the first power voltage node 501 to the first output node OP and the second output node ON may increase and the voltage levels of the first output node OP and the second output node ON may increase. When the voltage level of the first output signal OUTP transitions from a logic high level to a logic low level and the voltage level of the second output signal OUTN transitions from a logic low level to a logic high level, the first load control signal LC11 may also transition to a logic low level. When the first switching transistor 521 is turned on and couples the first load resistor RL1 and the second load resistor RL2 to each other in parallel, the voltage level of the first output signal OUTP may increase and the swing range of the first output signal OUTP and the second output signal OUTN may decrease. When the voltage level of the first output signal OUTP increases, time required for the first output signal OUTP to transition from a logic low level to a logic high level may decrease and duration of the high-level section of the first output signal OUTP may increase. Also, time required for the second output signal OUTN to transition from a logic high level to a logic low level may decrease and duration of the high-level section of the second output signal OUTN may decrease. Therefore, the duty ratio of the first output signal OUTP may increase and the duty ratio of the second output signal OUTN may decrease.

In order to decrease the duty ratio of the first output signal OUTP, the load control circuit 530 may output the second output signal OUTN as the second load control signal LC12 while keeping the first load control signal LC11 disabled. The second switching transistor 522 may be turned on in a time period when the voltage level of the second load control signal LC12 is a logic low level, i.e., in a time period when the voltage level of the second output signal OUTN is a logic low level. When the second switching transistor 522 is turned on, the first load resistor RL1 and the second load resistor RL2 may be coupled to each other in parallel and therefore the resistance value among the first power voltage node 501, the first output node OP, and the second output node ON may decrease. When the resistance value among the first power voltage node 501, the first output node OP, and the second output node ON decreases, the amounts of the currents provided from the first power voltage node 501 to the first output node OP and the second output node ON may increase and the voltage levels of the first output node OP and the second output node ON may increase. When the voltage level of the first output signal OUTP transitions from a logic low level to a logic high level and the voltage level of the second output signal OUTN transitions from a logic high level to a logic low level, the second load control signal LC12 may also transition to a logic low level. When the second switching transistor 522 is turned on and couples the first load resistor RL1 and the second load resistor RL2 to each other in parallel, the voltage level of the second output signal OUTN may increase and the swing range of the second output signal OUTN and the first output signal OUTP may decrease. When the voltage level of the second output signal OUTN increases, time required for the second output signal OUTN to transition from a logic low level to a logic high level may decrease and duration of the high-level section of the second output signal OUTN may increase. Also, time required for the first output signal OUTP to transition from a logic high level to a logic low level may decrease and duration of the high-level section of the first output signal OUTP may decrease. Therefore, the duty ratio of the first output signal OUTP may decrease and the duty ratio of the second output signal OUTN may increase.

In order to advance the phase of the first output signal OUTP, the load control circuit 530 may output the first output signal OUTP as the first load control signal LC11 and may output the second output signal OUTN as the second load control signal LC12. The first switching transistor 521 may be turned on in a time period when the voltage level of the first load control signal LC11 is a logic low level, i.e., in a time period when the voltage level of the first output signal OUTP is a logic low level. The second switching transistor 522 may be turned on in a time period when the voltage level of the second load control signal LC12 is a logic low level, i.e., in a time period when the voltage level of the second output signal OUTN is a logic low level. Therefore, based on the first load control signal LC11 and the second load control signal LC12, the first load resistor RL1 and the second load resistor RL2 may continuously stay coupled to each other in parallel. In a time period when the voltage level of the first output signal OUTP is a logic low level, the voltage level of the first output signal OUTP may increase and the swing range of the first output signal OUTP and the second output signal OUTN may decrease. In a time period when the voltage level of the second output signal OUTN is a logic low level, the voltage level of the second output signal OUTN may increase and the swing range of the second output signal OUTN and the first output signal OUTP may decrease. Therefore, time required for the first output signal OUTP to transition from a logic low level to a logic high level and time required for the first output signal OUTP to transition from a logic high level to a logic low level may all decrease. In a similar way, time required for the second output signal OUTN to transition from a logic low level to a logic high level and time required for the second output signal OUTN to transition from a logic high level to a logic low level may all decrease. When the transition time of the first output signal OUTP and the second output signal OUTN decrease, a time point when the first output signal OUTP and the second output signal OUTN are output may be advanced and delay time required to generate the first output signal OUTP and the second output signal OUTN may decrease.

Figure 6:
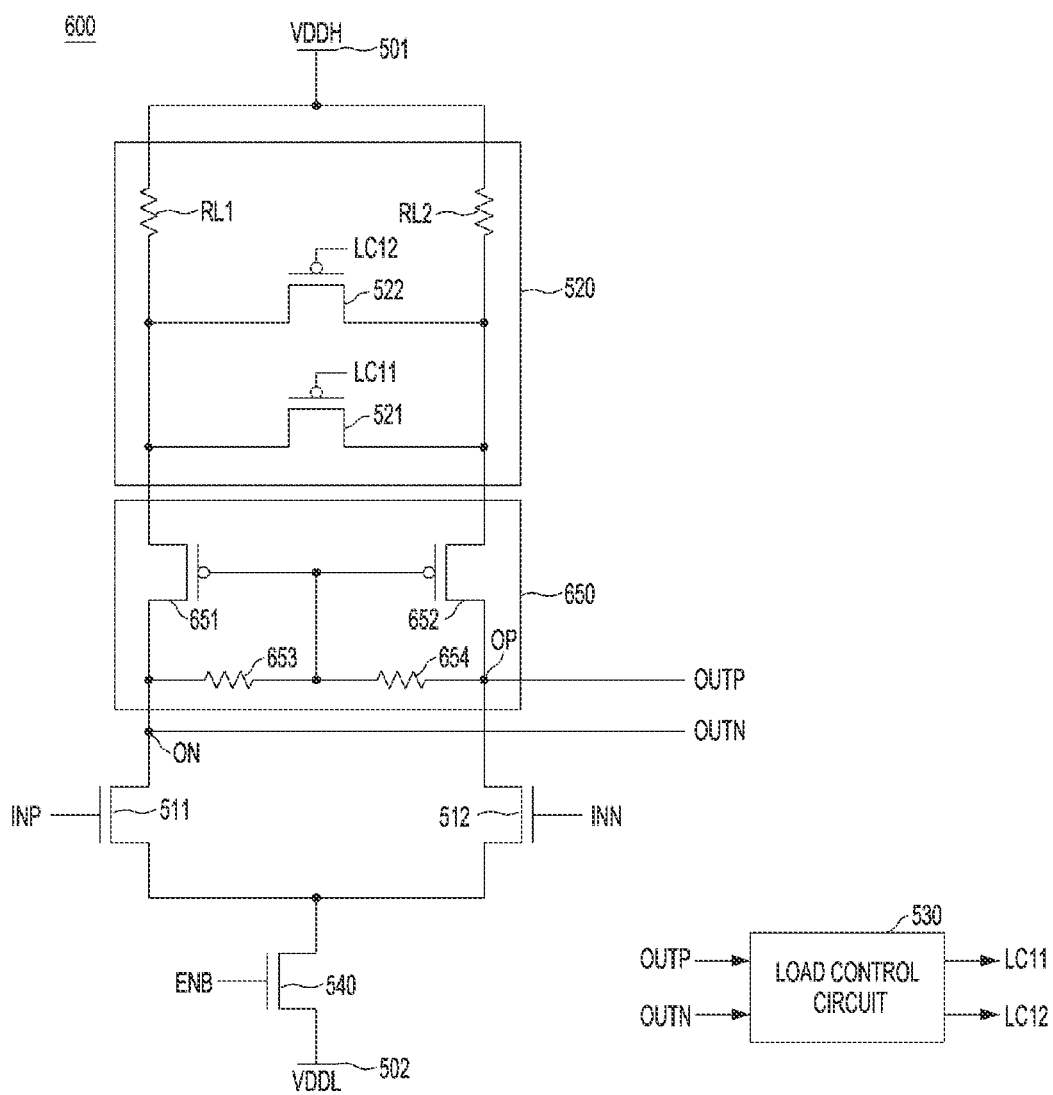
FIG. 6 is a diagram illustrating a configuration of a buffer circuit in accordance with an embodiment.

FIG. 6 is a diagram illustrating a configuration of a buffer circuit 600 in accordance with an embodiment. Except a partial configuration, the buffer circuit 600 may have the same configuration as the buffer circuit 500 illustrated in FIG. 5. Between the embodiments of FIGS. 5 and 6, the same elements have the same reference numerals and redundant description on the same elements will be omitted. Referring to FIG. 6, the buffer circuit 600 may additionally include a common mode load circuit 650. The common mode load circuit 650 may be coupled among the first output node OP, the second output node ON, and the load circuit 520. The common mode load circuit 650 may operate as a load of the buffer circuit 600 based on a common mode voltage of the buffer circuit 600. The common mode voltage may have a voltage level corresponding to a middle between the first output signal OUTP and the second output signal OUTN.

The common mode load circuit 650 may include a first transistor 651, a second transistor 652, a first resistor 653, and a second resistor 654. The first transistor 651 may be coupled to the second output node ON and one end of the first load resistor RL1. The second transistor 652 may be coupled to the first output node OP and one end of the second load resistor RL2. Each of the first transistor 651 and the second transistor 652 may be a P-channel MOS transistor. The first transistor 651 may be coupled to the second output node ON at its drain and the one end of the first load resistor RL1 at its source. The second transistor 652 may be coupled to the first output node OP at its drain and the one end of the second load resistor RL2 at its source. One end of the first resistor 653 may be coupled to the second output node ON and the other end of the first resistor 653 may be commonly coupled to gates of the first transistor 651 and the second transistor 652. One end of the second resistor 654 may be coupled to the first output node OP and the other end of the second resistor 654 may be commonly coupled to the gates of the first transistor 651 and the second transistor 652.

Figure 7:
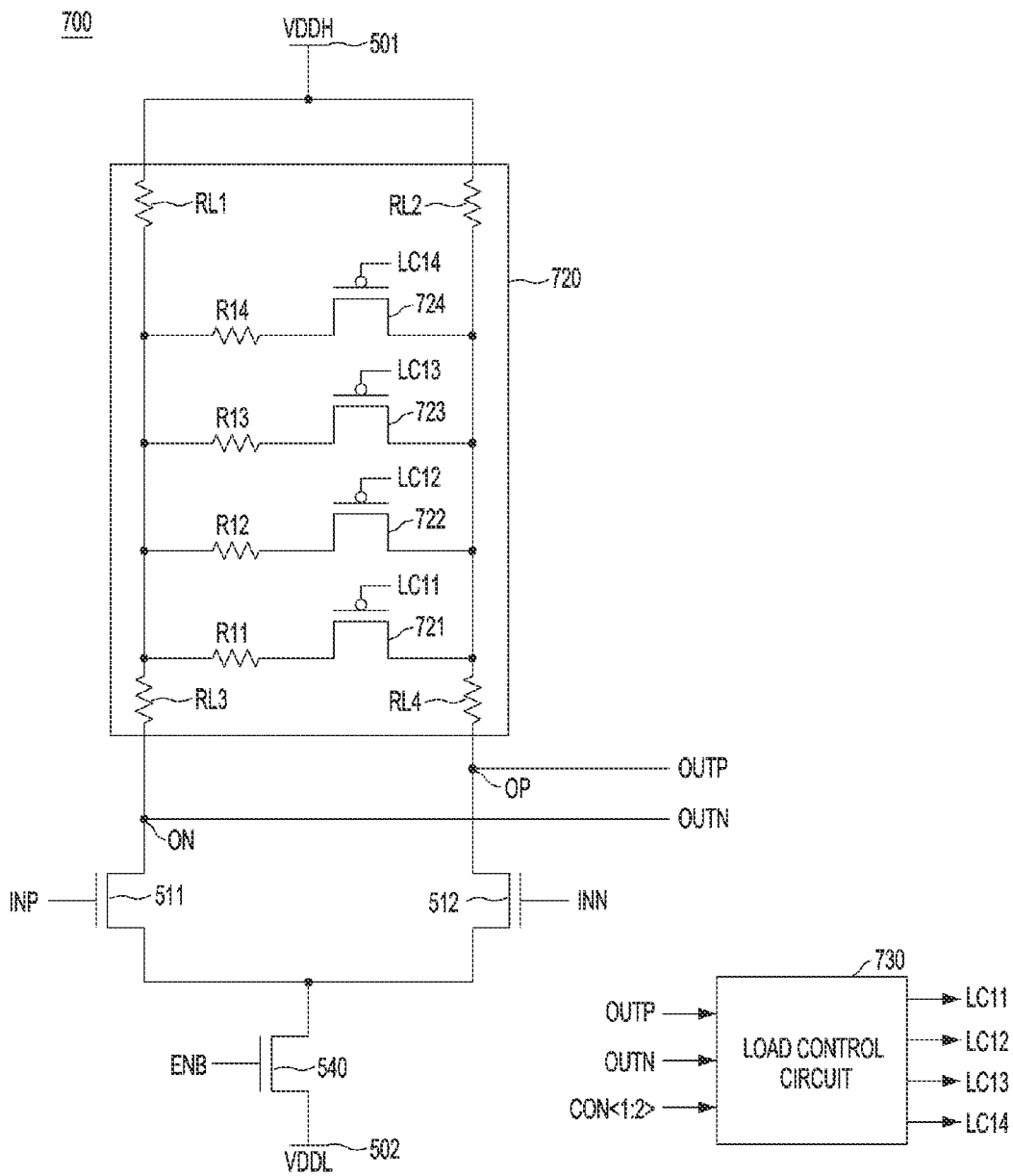
FIG. 7 is a diagram illustrating a configuration of a buffer circuit in accordance with an embodiment.

FIG. 7 is a diagram illustrating a configuration of a buffer circuit 700 in accordance with an embodiment. The buffer circuit 700 may have a similar configuration to the buffer circuit 500 illustrated in FIG. 5. Between the embodiments of FIGS. 5 and 7, the same elements have the same reference numerals and redundant description on the same elements will be omitted. Referring to FIG. 7, the load control circuit 730 may receive the first output signal OUTP and the second output signal OUTN and may further receive a resistance control signal CON<1:2>. The load control circuit 730 may generate a first load control signal LC11 and a third load control signal LC13 based on the first output signal OUTP and the resistance control signal CON<1:2>. The load control circuit 730 may generate a second load control signal LC12 and a fourth load control signal LC14 based on the second output signal OUTN and the resistance control signal CON<1:2>.

In order to increase the duty ratio of the first output signal OUTP, the load control circuit 730 may provide the first output signal OUTP as the first load control signal LC11 and the third load control signal LC13 while keeping the second load control signal LC12 and the fourth load control signal LC14 disabled. Based on the resistance control signal CON<1:2>, the load control circuit 730 may selectively output each of the first load control signal LC11 and the third load control signal LC13. In order to decrease the duty ratio of the first output signal OUTP, the load control circuit 730 may provide the second output signal OUTN as the second load control signal LC12 and the fourth load control signal LC14 while keeping the first load control signal LC11 and the third load control signal LC13 disabled. Based on the resistance control signal CON<1:2>, the load control circuit 730 may selectively output each of the second load control signal LC12 and the fourth load control signal LC14. In order to advance the phase of the first output signal OUTP, the load control circuit 730 may provide the first output signal OUTP as the first load control signal LC11 and the third load control signal LC13 and may provide the second output signal OUTN as the second load control signal LC12 and the fourth load control signal LC14. Based on the resistance control signal CON<1:2>, the load control circuit 730 may selectively output each of the first to fourth load control signals LC11 to LC14.

The load circuit 720 may variously adjust the resistance value among the first output node OP, the second output node ON, and the second power voltage node 502 based on the first to fourth load control signals LC11 to LC14. The load circuit 720 may include a first load resistor RL1, a second load resistor RL2, a first switching transistor 721, a second switching transistor 722, a third switching transistor 723, and a fourth switching transistor 724. The first switching transistor 721 may be coupled between one end of the first load resistor RL1 and one end of the second load resistor RL2. The first switching transistor 721 may receive the first load control signal LC11. The second switching transistor 722 may be coupled between the one end of the first load resistor RL1 and the one end of the second load resistor RL2. The second switching transistor 722 may receive the second load control signal LC12. The third switching transistor 723 may be coupled between the one end of the first load resistor RL1 and the one end of the second load resistor RL2. The third switching transistor 723 may receive the third load control signal LC13. The fourth switching transistor 724 may be coupled between the one end of the first load resistor RL1 and the one end of the second load resistor RL2. The fourth switching transistor 724 may receive the fourth load control signal LC14. A turn-on resistance value of the third switching transistor 723 may be the same as or different from a turn-on resistance value of the first switching transistor 721. A turn-on resistance value of the fourth switching transistor 724 may be the same as or different from a turn-on resistance value of the second switching transistor 722. For example, when the turn-on resistance value of the first switching transistor 721 is smaller than the turn-on resistance value of the third switching transistor 723, the load control circuit 730 may output both of the first load control signal LC11 and the third load control signal LC13 to adjust, to a maximum, the amount to decrease in the resistance value of the load circuit 720. The load control circuit 730 may output only the third load control signal LC13 to adjust, to a minimum, the amount to decrease in the resistance value of the load circuit 720. The load control circuit 730 may output only the first load control signal LC11 to adjust, between the maximum and the minimum, the amount to decrease in the resistance value of the load circuit 720. In a similar way, when the turn-on resistance value of the second switching transistor 722 is smaller than the turn-on resistance value of the fourth switching transistor 724, the load control circuit 730 may output both of the second load control signal LC12 and the fourth load control signal LC14 to adjust, to a maximum, the amount to decrease in the resistance value of the load circuit 720. The load control circuit 730 may output only the fourth load control signal LC14 to adjust, to a minimum, the amount to decrease in the resistance value of the load circuit 720. The load control circuit 730 may output only the second load control signal LC12 to adjust, between the maximum and the minimum, the amount to decrease in the resistance value of the load circuit 720.

The load circuit 720 may further include a first resistor R11, a second resistor R12, a third resistor R13, and a fourth resistor R14. The first resistor R11 may be serially coupled to the first switching transistor 721. The second resistor R12 may be serially coupled to the second switching transistor 722. The third resistor R13 may be serially coupled to the third switching transistor 723. The fourth resistor R14 may be serially coupled to the fourth switching transistor 724. A resistance value of the third resistor R13 may be the same as or different from a resistance value of the first resistor R11. A resistance value of the fourth resistor R14 may be the same as or different from a resistance value of the second resistor R12. The first resistor R11 and the third resistor R13 may be serially coupled to the first switching transistor 721 and the third switching transistor 723, respectively, to variously change the amount that the buffer circuit 700 is to adjust in the duty ratio of the first output signal OUTP or the amount that the buffer circuit 700 is to adjust in the phase of the first output signal OUTP. The second resistor R12 and the fourth resistor R14 may be serially coupled to the second switching transistor 722 and the fourth switching transistor 724, respectively, to variously change the amount that the buffer circuit 700 is to adjust in the duty ratio of the first output signal OUTP or the amount that the buffer circuit 700 is to adjust in the phase of the first output signal OUTP.

The load circuit 720 may further include a third load resistor RL3 and a fourth load resistor RL4. The third load resistor RL3 may be serially coupled to the first load resistor RL1 between the second output node ON and the first load resistor RL1. The fourth load resistor RL4 may be serially coupled to the second load resistor RL2 between the first output node OP and the second load resistor RL2. A resistance value of the fourth load resistor RL4 may be substantially the same as a resistance value of the third load resistor RL3.

While certain embodiments have been described above, it will be understood to those skilled in the art that the embodiments described are by way of example only. Accordingly, the buffer circuit should not be limited based on the described embodiments. Rather, the buffer circuit described herein should only be limited in light of the claims that follow when taken in conjunction with the above description and accompanying drawings.

What is claimed is:

1. A buffer circuit comprising:
   a first input transistor coupled between a first power voltage node and a second output node, and configured to change a voltage level of the second output node based on a first input signal;
   a second input transistor coupled between the first power voltage node and a first output node, and configured to change a voltage level of the first output node based on a second input signal;
   a first load resistor coupled between the second output node and a second power voltage node;
   a second load resistor coupled between the first output node and the second power voltage node; and
   at least one switching transistor configured to couple the first load resistor and the second load resistor to each other in parallel based on the at least one of a first output signal from the first output node and a second output signal from the second output node.

2. The buffer circuit of claim 1, wherein the buffer circuit is configured to decrease a duty ratio of the first output signal output from the first output node by turning on the at least one switching transistor in a time period when the voltage level of the first output node is a logic high level.

3. The buffer circuit of claim 1, wherein the buffer circuit is configured to increase a duty ratio of the first output signal output from the first output node by turning on the at least one switching transistor in a time period when the voltage level of the second output node is a logic high level.

4. The buffer circuit of claim 1, wherein the buffer circuit is configured to advance a phase of the first output signal output from the first output node by turning on the at least one switching transistor in a time period when the voltage level of the first output node is a logic high level and a time period when the voltage level of the second output node is a logic high level.

5. A buffer circuit comprising:
   a first input transistor coupled between a first power voltage node and a second output node, and configured to change a voltage level of the second output node based on a first input signal;
   a second input transistor coupled between the first power voltage node and a first output node, and configured to change a voltage level of the first output node based on a second input signal;

a load control circuit configured to generate at least one load control signal based on a first output signal output from the first output node and a second output signal output from the second output node;
a first load resistor coupled between the second output node and a second power voltage node;
a second load resistor coupled between the first output node and the second power voltage node; and
at least one switching transistor configured to couple the first load resistor and the second load resistor to each other in parallel based on the at least one load control signal.

6. The buffer circuit of claim 5,
wherein the load control circuit is configured to provide the first output signal as a first load control signal, and
wherein the at least one switching transistor couples the first and second load resistor based on the first load control signal.

7. The buffer circuit of claim 5,
wherein the load control circuit is configured to provide the second output signal as a second load control signal, and
wherein the at least one switching transistor couples the first and second load resistor based on the second load control signal.

8. The buffer circuit of claim 5,
wherein the load control circuit is configured to provide the first output signal as a first load control signal and provide the second output signal as a second load control signal, and
wherein the at least one switching transistors couples the first and second load resistors based on the first load control signal and the second load control signal.

9. The buffer circuit of claim 5, further comprising:
a third load resistor serially coupled to the first load resistor between the first load resistor and the second output node; and
a fourth load resistor serially coupled to the second load resistor between the second load resistor and the first output node.

10. The buffer circuit of claim 5, wherein the at least one switching transistor includes:
a first switching transistor configured to couple the first load resistor and the second load resistor to each other in parallel based on a first load control signal; and
a second switching transistor configured to couple the first load resistor and the second load resistor to each other in parallel based on a second load control signal.

11. The buffer circuit of claim 10, comprising:
a third load resistor serially coupled to the first load resistor between the first load resistor and the second output node; and
a fourth load resistor serially coupled to the second load resistor between the second load resistor and the first output node.

12. The buffer circuit of claim 5,
wherein the load control circuit is configured to further receive a resistance control signal, configured to generate a first load control signal and a third load control signal based on the first output signal and the resistance control signal, and configured to generate a second load control signal and a fourth load control signal based on the second output signal and the resistance control signal, and wherein the at least one switching transistor includes:
a first switching transistor configured to couple the first load resistor and the second load resistor to each other in parallel based on the first load control signal;
a second switching transistor configured to couple the first load resistor and the second load resistor to each other in parallel based on the second load control signal;
a third switching transistor configured to couple the first load resistor and the second load resistor to each other in parallel based on the third load control signal; and
a fourth switching transistor configured to couple the first load resistor and the second load resistor to each other in parallel based on the fourth load control signal.

13. The buffer circuit of claim 12, wherein a turn-on resistance value of the first switching transistor is different from a turn-on resistance value of the third switching transistor.

14. The buffer circuit of claim 12, wherein a turn-on resistance value of the second switching transistor is different from a turn-on resistance value of the fourth switching transistor.

15. The buffer circuit of claim 12, comprising:
a first resistor serially coupled to the first switching transistor;
a second resistor serially coupled to the second switching transistor;
a third resistor serially coupled to the third switching transistor; and
a fourth resistor serially coupled to the fourth switching transistor.

16. The buffer circuit of claim 12, further comprising:
a third load resistor serially coupled to the first load resistor between the first load resistor and the second output node; and
a fourth load resistor serially coupled to the second load resistor between the second load resistor and the first output node.

17. The buffer circuit of claim 5, further comprising a common mode load circuit coupled among the first output node, the second output node, and the load circuit.

18. A buffer circuit comprising:
a first input transistor coupled between a first power voltage node and a second output node, and configured to change a voltage level of the second output node based on a first input signal;
a second input transistor coupled between the first power voltage node and a first output node, and configured to change a voltage level of the first output node based on a second input signal;
a load control circuit configured to generate a first load control signal and a second load control signal based on a first output signal output from the first output node and a second output signal output from the second output node;
a first load resistor including one end coupled to the second output node and the other end coupled to the second power voltage node;
a second load resistor including one end coupled to the first output node and the other end coupled to the second power voltage node;
a first switching transistor configured to couple the one end of the first load resistor and the one end of the second load resistor to each other based on the first load control signal; and
a second switching transistor configured to couple the one end of the first load resistor and the one end of the second load resistor to each other based on the second load control signal.

19. The buffer circuit of claim 18, wherein the load control circuit is configured to provide the first output signal as the first load control signal and disable the second load control signal, to adjust a duty ratio of the first output signal.

20. The buffer circuit of claim 18, wherein the load control circuit is configured to provide the second output signal as the second load control signal and disable the first load control signal, to adjust a duty ratio of the first output signal.

21. The buffer circuit of claim 18, wherein the load control circuit is configured to provide the first output signal as the first load control signal and provide the second output signal as the second load control signal, to advance a phase of the first output signal.

22. The buffer circuit of claim 8, further comprising:
    a third load resistor serially coupled to the first load resistor between the first load resistor and the second output node; and
    a fourth load resistor serially coupled to the second load resistor between the second load resistor and the first output node.

23. The buffer circuit of claim 18, wherein the load control circuit is configured to further receive a resistance control signal, configured to generate the first load control signal and a third load control signal based on the first output signal and the resistance control signal, and configured to generate the second load control signal and a fourth load control signal based on the second output signal and the resistance control signal.

24. The buffer circuit of claim 23, further comprising:
    a third switching transistor configured to couple the one end of the first load resistor and the one end of the second load resistor to each other based on the third load control signal; and
    a fourth switching transistor configured to couple the one end of the first load resistor and the one end of the second load resistor to each other based on the fourth load control signal.

25. The buffer circuit of claim 24, wherein a turn-on resistance value of the third switching transistor is different from a turn-on resistance value of the first switching transistor.

26. The buffer circuit of claim 24, wherein a turn-on resistance value of the fourth switching transistor is different from a turn-on resistance value of the second switching transistor.

27. The buffer circuit of claim 24, further comprising:
    a first resistor serially coupled to the first switching transistor;
    a second resistor serially coupled to the second switching transistor;
    a third resistor serially coupled to the third switching transistor; and
    a fourth resistor serially coupled to the fourth switching transistor.

28. The buffer circuit of claim 18, further comprising a common mode load circuit coupled among the first output node, the second output node, the one end of the first load resistor, and the one end of the second load resistor.

* * * * *